United States Patent

Johnson et al.

(12) United States Patent
(10) Patent No.: US 6,669,795 B2
(45) Date of Patent: Dec. 30, 2003

(54) METHODS OF FABRICATING HIGH TRANSITION TEMPERATURE SMA, AND SMA MATERIALS MADE BY THE METHODS

(75) Inventors: A. David Johnson, San Leandro, CA (US); Valery Martynov, San Francisco, CA (US)

(73) Assignee: TiNi Alloy Company, San Leandro, CA (US)

(*) Notice: Subject to any disclaimer, the term of this patent is extended or adjusted under 35 U.S.C. 154(b) by 38 days.

(21) Appl. No.: 10/051,737

(22) Filed: Jan. 17, 2002

(65) Prior Publication Data

US 2003/0131915 A1 Jul. 17, 2003

(51) Int. Cl.[7] .............................................. C23C 14/14
(52) U.S. Cl. .................... 148/563; 148/402; 204/192.15
(58) Field of Search ................................ 148/563, 402; 204/192.15

(56) References Cited

U.S. PATENT DOCUMENTS

| | | | | | |
|---|---|---|---|---|---|
| 5,114,504 A | * | 5/1992 | AbuJudom et al. | ......... | 148/402 |
| 5,641,364 A | * | 6/1997 | Golberg et al. | ............. | 148/563 |
| 6,454,913 B1 | * | 9/2002 | Rasmussen et al. | ... | 204/192.15 |
| 6,533,905 B2 | * | 3/2003 | Johnson et al. | ........ | 204/192.15 |

OTHER PUBLICATIONS

Pauling, Linus, *College Chemistry*, second edition, W.H. Freeman and Company, San Francisco, 1955, pp. 81–91.*

* cited by examiner

*Primary Examiner*—George Wyszomierski
(74) *Attorney, Agent, or Firm*—Richard E. Backus

(57) ABSTRACT

A method of fabricating ternary TiNi-based alloys to achieve substantially higher phase-change transition temperatures in the resulting SMA materials and which have optimal thermo-mechanical properties. One target is provided which comprises the element Ti, a second target comprises the element Ni and a third target comprises an element which when combined with Ti and Ni can produce a shape memory alloy. The three targets are co-sputtered onto a substrate at rates which are controlled so that the sum of the percentage composition of the elements that are from the left side of the periodic table are substantially 50 atomic percent, and the sum of percentage composition of the elements that are from the right side of the periodic table comprise the remaining 50 atomic percent.

6 Claims, 1 Drawing Sheet

# METHODS OF FABRICATING HIGH TRANSITION TEMPERATURE SMA, AND SMA MATERIALS MADE BY THE METHODS

STATEMENT OF GOVERNMENT RIGHTS

This invention was made under contract with an agency of the United States Government: Defense Advanced Research Projects Agency, U.S. Army Aviation & Missile Command, Contract No. DAAH01-01-C-R125.

BACKGROUND OF THE INVENTION

1. Field of the Invention

This invention relates in general to materials comprised of shape memory alloys (also called SMA). The invention also relates to the fabrication of thin film SMA of the type used in devices employed in various fields, such as aerospace, medicine, instrumentation and consumer products.

2. Description of the Related Art

Shape memory alloys have been employed in various devices and products, as for example actuators, valves, switches, latches and the like. Miniature devices made of SMA in thin film form have been advantageously employed in Microelectronic mechanical systems (called MEMS). The basic procedures for fabricating SMA in thin film form are disclosed in the Busch et. al. U.S. Pat. No. 5,061,914 issued Oct. 29, 1991 and which is assigned to the assignee of the present invention.

As is well known, an SMA thin film or other form undergoes a crystalline phase change or transformation from martensite to austenite when heated through the material's phase-change transition temperature. When below that temperature in a "cold state" the material can be plastically deformed responsive to stress. When the SMA is heated through the transition temperature, it forcefully reverts to its "memory shape" while exerting considerable force.

A common SMA material with usable shape memory alloy properties is comprised of TiNi. These TiNi SMA materials have good thermo-mechanical properties, but their phase-change transition temperatures are limited to less than 100° C. Binary TiNi has a transition temperature with an upper limit of about 90° C. SMA materials of TiNiHf as well as TiNiPd have been shown to have transition temperatures up to 300° C., but these have not been commercially acceptable because they are generally brittle and difficult to fabricate into devices. It is desirable to have SMA material with transition temperatures higher than 100° C. while retaining the desired ductility and shape memory effect. Many applications require higher transition temperatures, but no conventional SMA material has been found to be satisfactory for these purposes.

The shape memory effect of an SMA material which is desirable for various applications, such as for actuators used in aerospace, medicine, the military and consumer products, derives from an energetic thermally driven crystalline phase change. The two phases, termed austenite and martensite, have radically different mechanical properties, and a very large amount of mechanical work can be recovered during the transformation. The most widely used SMA, namely TiNi (also called Nitinol), is an equi-atomic alloy of titanium and nickel. The TiNi phase transformation temperature depends critically upon the stoichiometry: increasing the atomic percentage of Ni lowers the transformation temperature, while increasing the Ti atomic percentage raises that temperature to a maximum of about 100° C.

Many of the applications contemplated for the use of an SMA material are in situations where the ambient temperature exceeds 100° C. Previous research has demonstrated transition temperatures in excess of 100° C. for ternary TiNi-based alloys containing hafnium (replacing titanium) and palladium (replacing nickel), but generally the TiNiHF and TiNiPd alloys produced in experimental quantities exhibited large hysteresis and brittleness. Practical alloys that overcome these deficiencies and that have a phase-change transition temperature above 100° C. will expand its use potential in a variety of markets.

The need has therefore been recognized for a method of fabrication, and materials made by the method, comprised of high transition temperature SMA materials which obviate the foregoing and other limitations and disadvantages of prior art SMA. Despite the various SMA materials in the prior art, there has heretofore not been provided a suitable and attractive solution to these problems.

OBJECTS OF THE INVENTION

It is a general object of the invention to provide a method of fabricating shape memory alloys into thin films, and SMA materials made by the method.

Another object is to provide a method of fabrication thin film shape memory alloys, and alloys made by the method, that have optimal thermo-electrical properties, particularly with higher phase-change transition temperatures.

A further object is to provide a method of fabricating thin film shape memory alloys, and alloys made by the method, that have phase-change transition temperatures well above 100° C.

DESCRIPTION OF THE PREFERRED EMBODIMENTS

Figure 1:
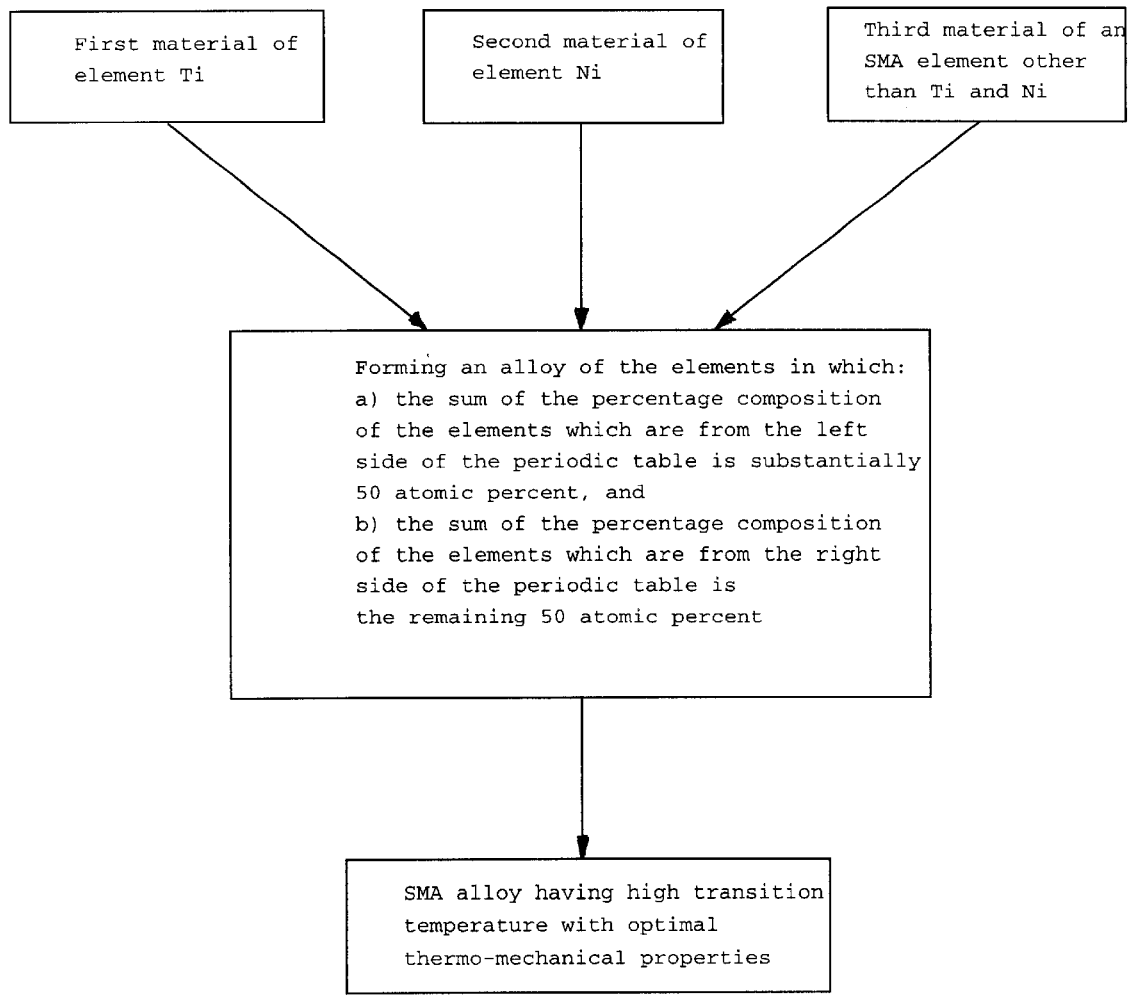
FIG. 1 is a flow chart showing the steps in a thin film SMA fabrication method in accordance with one embodiment of the invention.

In the drawings the flow chart of FIG. 1 shows the general steps in the method of one preferred embodiment of the invention for fabricating thin film shape memory alloys having phase-change transition temperatures substantially higher than the transition temperatures of conventional SMA materials while maintaining desirable optimal thermo-mechanical properties, such as ductility and shape memory effect.

In general the method of the invention fabricates ternary Ti Ni-based alloys to achieve substantially higher phase-change transition temperatures in the resulting SMA materials, and in which the compositions of the elements are selected and accurately controlled so that the SMA has optimal thermo-mechanical properties. The method provides that the sum of percentage composition of the elements that are from the left side of the periodic table (i.e. Ti, Zr, Hf) is near 50 atomic percent, and similarly the sum of percentage composition of the elements that are from the right side of the periodic table (i.e. Ni, Pd, Pt and Cu) comprise the remaining 50 atomic percent. Small variations in the composition of the elements produce significant thermomechanical effect in TiNi-based ternary SMAs, so the composition accuracy must be accurately controlled.

In the case of fabricating, for example, the ternary alloy TiNiHf, the method calls for the addition of Hf to cause Hf atoms to replace Ti atoms in the crystal since Hf has a similar outer electron shell. Conversely, Pd replaces Ni. To maintain the ordered body-centered cubic crystal form found in equi-atomic TiNi, the ternary alloy should have 50 atomic percent (Ti+Hf), and/or 50 percent (Ni+Pd) in the case of fabricating the ternary alloy TiNiPd.

To make a thin film of the desired ternary SMA, targets or materials consisting of the composite elements are co-sputtered (using known vacuum sputtering techniques) onto a substrate. For example, to fabricate a ternary alloy of TiNiHf, a first target that is 50 atomic % Ni, and 50 atomic % Ti is provided. Two other targets are provided, one of Hf and the other of Ni. Material from the targets are co-sputtered onto a suitable substrate, such as Si. The sputtering rates are calibrated so that for each atom of Hf added an atom of Ni is added to preserve the original 50 atomic %. The sputtering rates are varied as required by controlling power to individual targets based on measured deposition rates.

Throughout the co-sputtering step the 50/50 ratio is maintained to preserve the properties of the film. Because the sputtering rates are very different for the Ti, Hf and Ni, the accuracy with which the composition of the film can be predicted is only about 1 to 2%.

In another embodiment, the first target or material consists of TiNi alloy, the second consists of Ni and the third consists of Hf. During the co-sputtering steps of this embodiment, the rates at which Ti and Ni are deposited from the first and second targets are calculated to thereby separately control power levels to the three targets in a manner sufficient to add the rate that Hf is being deposited to maintains the 50/50 ratio.

In a further embodiment, the first target or material consists of Ti, the second consists of Ni alloyed with Hf, Zr, Pd, Pt or Cu and the third consists of the respective Hf, Zr, Pd, Pt or Cu. During the co-sputtering steps of this embodiment, the rates at which the elements from the first and second targets are deposited are calculated to thereby separately control power levels to the three targets in a manner sufficient to add the respective Hf, Zr, Pd, Pt and Cu at a rate that maintains the 50/50 ratio.

The composition measurement must therefor be accurate, and preferably it is controlled to be within 0.1% accuracy. Because conventional analytical tools are not generally available to make measurements to this accuracy, the measurements can be made by the use of conventional energy dispersive spectroscopy ("EDS") equipment, but while employing the following procedures. The measurements are made with a scanning electron microscope. With two samples (of the elements making up the ternary alloy) placed close together on the same substrate in the measuring instrument, it is has been found possible to compare their percentage compositions to a higher precision because many of the sources of potential error are obviated. These potential error sources comprise sample alignment, drift in electron beam current and voltage as well as other physical things that vary with time and location within the measuring instrument. These contribute to errors in absolute measurements but do not apply to the "ranking" of adjacent samples, as described above.

Measurements of adjacent samples are carried out by the following steps. A bulk material of each of the desired elements for the ternary alloy of known composition is polished so that it is suitable for sputter deposition and for SEM analysis. Then a sample whose composition is only approximately known is sputter deposited onto the polished surface of the known sample. Miniature openings are made by photolithography in the "unknown" sputtered layer, exposing the "known" substrate. The two samples then are only a few microns apart so that it is possible to scan them with nearly the same setting of the instrument, resulting in minimal measurement error. Measurements can be repeated until the statistics are satisfactory: sequential measurements on the same sample must agree within a fraction of one percent. The composition of the "unknown" sample can then be easily and accurately calculated.

Transition temperatures of the deposited specimens can be determined by using resistivity measurements. The ductility and shape recovery properties of the samples can be measured by using stress-strain-temperature isotherms.

Devices for the desired end-use application can then be sculpted from the sample ternary SMA film by conventional photolithographic patterning and chemical machining, rather than hot rolling and drawing, so that thermal and mechanical properties can be tested. The resulting device can then be used in the desired apparatus or product, such as a valve actuator, where transformation temperatures between 100 and 150° C. are required or desirable.

While the foregoing embodiments are at present considered to be preferred, it is understood that numerous variations and modifications may be made therein by those skilled in the art and it is intended that the invention includes all such variations and modifications that fall within the true spirit and scope of the invention as set forth in the appended claims.

What is claimed is:

1. A method of fabricating ternary TiNi-based alloys having high phase-change transition temperatures and optimal thermo-mechanical properties, the method comprising the steps of providing a first material comprised of the element Ti, providing a second material comprised of the element Ni and providing a third material comprised of an element other than Ti and Ni which when alloyed with Ti and Ni can produce a shape memory alloy, the first, second and third materials being comprised of respective first, second and third targets, and forming an alloy by co-sputtering the elements of the first, second and third material onto a substrate in the form of a thin film with the alloy being characterized in having the sum of the percentage composition of the elements that are from the left side of the periodic table being substantially 50 atomic percent, and the sum of the percentage composition of the elements that are from the right side of the periodic table being the remaining 50 atomic percent.

2. A method as in claim 1 in which the co-sputtering step is carried out by maintaining a 50/50 ratio of the rate at which the sum of the elements from the left side of the periodic table are co-sputtered onto the substrate in proportion to the rate at which the sum of the elements from the right side of the periodic table are co-sputtered onto the substrate.

3. A method as in claim 1 in which the first material is comprised of TiNi alloy.

4. A ternary TiNi-based alloy made by the method of claim 1.

5. A ternary TiNi-based alloy made by the method of claim 2.

6. A ternary TiNi-based alloy made by the method of claim 3.

* * * * *